United States Patent [19]

Lewis et al.

[11] 4,097,750

[45] Jun. 27, 1978

[54] METHOD OF ORIENTING OBJECTS USING OPTICALLY SMEARED IMAGES

[75] Inventors: Robert W. Lewis, Rochester; Bernard W. Joseph, Berkley; Frederick R. Faxvog, Rochester, all of Mich.

[73] Assignee: General Motors Corporation, Detroit, Mich.

[21] Appl. No.: 779,158

[22] Filed: Mar. 18, 1977

[51] Int. Cl.² ............................................. G01N 21/30
[52] U.S. Cl. .................................. 250/548; 356/152; 356/172
[58] Field of Search ....................... 356/141, 152, 172; 250/548, 557, 234, 235, 236

[56] References Cited

U.S. PATENT DOCUMENTS

| 3,683,195 | 8/1972 | Johannsmeier | 250/548 |
| 3,867,038 | 2/1975 | Westell | 356/172 |
| 3,943,359 | 3/1976 | Matsumoto et al. | 356/152 |

Primary Examiner—David C. Nelms

Attorney, Agent, or Firm—Warren D. Hill

[57] ABSTRACT

The orientation of an industrial part such as a microcircuit chip having a pattern of dominant parallel lines is determined by an optical method. An image of the parallel line pattern is smeared or defocused in a known direction such that the resultant smeared image of the part reveals the lines in sharp detail when they are parallel to the known direction of smearing and are blurred if the lines are angularly displaced from the known direction. By rotating the image of the pattern relative to the smear direction and determining the angle at which maximum sharpness occurs, the angular orientation is determined. By correlating the pattern of sharp lines of the smeared image with a similar reference pattern of known position, the positional orientation of the part is also determined. When two angularly displaced families of parallel lines are present on the object, positional coordinates relative to two axes are determined.

7 Claims, 11 Drawing Figures

METHOD OF ORIENTING OBJECTS USING OPTICALLY SMEARED IMAGES

This invention relates to an optical and electronic method of determining the orientation of a part having a pattern of parallel lines and in particular to such a method wherein at least one cylindrical lens is used to smear or defocus an image of the part to simplify analysis of the image.

In many types of industrial processes, machine handling of parts or other operations performed on parts requires a determination of the orientation of the part with respect to its angle and usually its coordinate position as well relative to some reference. Many such parts particularly those rectangular or elongated in nature are characterized by at least one set of parallel lines, for example, the physical boundaries of the part. In the case of microcircuit chips, patterns of parallel lines representing structural features of an electronic circuit are generally present often to a degree of high resolution and usually orthogonal sets of parallel lines are present. It is the practice to use wire bonding machines to automatically make connections between bonding pads on a microcircuit chip and an adjacent array of conductors. The angular and positional orientation of the microcircuit chip must be determined so that the chip can be correctly positioned relative to the wire bonding apparatus by a part manipulator or alternatively, the orientation of a chip already positioned within a wire bonding apparatus must be determined and made known to the apparatus so that the apparatus can be programmed to locate the precise location of each bonding pad.

The object of this invention is to provide a method of determining the orientation of a part by optically smearing an image of the part and analyzing the smeared image to determine sharpness of the lines on the part which extend substantially in the direction of smearing to thereby determine the angular orientation of the part.

Another object is to provide in conjunction with such a method the further method of determining coordinate position of the object by additional analysis of the smeared image.

The invention is carried out by forming an image of an object characterized by a pattern of parallel lines, smearing the image of a cylindrical lens so that the sharpness of the parallel lines in the smeared image depends on the relative angle between the lines and the direction of smearing, rotating the image relative to the cylindrical lens to determine the angle of maximum image sharpness and photoelectrically detecting the angular orientation of the parallel lines.

The invention is further carried out by optically and electrically establishing the coordinate position of the part by sensing the position of parallel lines.

The above and other advantages will be made more apparent from the following specification taken in conjunction with the accompanying drawings wherein like reference numerals refer to like parts and wherein.

Figure 1:
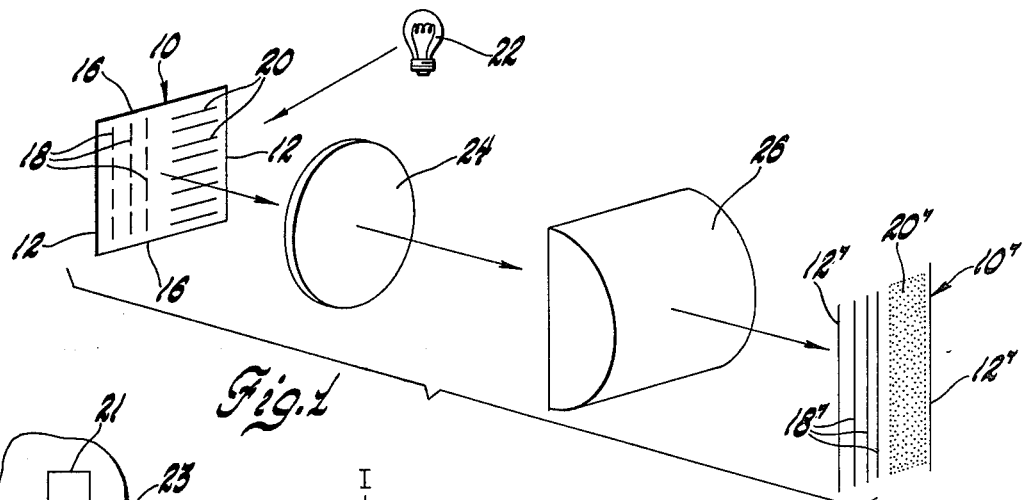
FIG. 1 is a diagrammatic illustration of an optical system illustrating a principle used in this invention.

FIG. 1 of the drawings illustrates the phenomenon of linearly smearing or defocusing an image by a cylindrical lens. An object 10 representing a microcircuit chip is rectangular in shape and includes two vertical side edges 12, two horizontal top and bottom edges 16, three broken parallel vertical lines 18 and a plurality of solid parallel horizontal lines 20. The object is illuminated by a light source 22. An imaging lens 24 forms an image of the object and the image is distorted along one direction by a cylindrical lens 26 having a horizontal axis of curvature. The resultant image 10' includes a series of sharp parallel lines 12' and 18' corresponding to the vertical lines 12 and 18 in the object. The defocusing action of the lens 26 in the vertical direction effectively integrates or spreads out each point in the object plane along a vertical line in the image plane so that the broken lines 18 in the object are spread out into solid lines 18' in the image and remain in sharp focus.

The horizontal lines 20 in the object space are also integrated or averaged along the vertical direction in the image space so that a blurred gray area 20' having no distinct line elements results. Similarly the horizontal edges 16 are integrated or spread throughout the image so as to be virtually indistinguishable. Thus the term "smearing" as used in this specification means optically, preferably by one or more cylindrical lenses, averaging the image of an object along one direction so that lines in the object parallel to the direction of smearing remain sharp in the image and lines in the object at an angle to the direction of smearing are smeared, blurred, or defocused in the image. While this specification refers to cylindrical lenses, it should be recognized that a lenticular screen comprising an ordered array of cylindrical lenses is included as an equivalent structure.

Figure 2A:
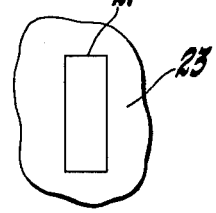
FIGS. 2a, 2b, 3a and 3b illustrate optical line scan signals used in carrying out the invention.
Figure 2B:
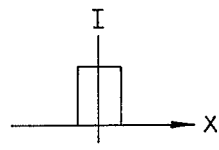

A characteristic of the smearing phenomenon is that a line which is at a slight angle from the direction of smearing is less sharp than an image line parallel to the direction of smearing and moreover, especially for long narrow lines, substantial loss of sharpness occurs for very small angular deviations from the direction of smearing. The loss of sharpness is illustrated in FIGS. 2 and 3. FIG. 2a shows a vertical rectangle 21 which represents an illuminated line on a dark background 23 of some definite height and width at a zero angle to smear direction. If an image of this line is smeared along the vertical direction, a photoelectric scan horizontally across the smeared image results in the intensity profile I represented in FIG. 2b as a square wave having vertical sides thereby denoting sharpness of the smeared image.

Figure 3A:
Figure 3B:
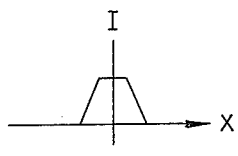

FIG. 3a depicts the same rectangular line 21 as in FIG. 2a but which is tilted throughout a small angle. A photoelectric scan across a vertically smeared image of that figure results in an intensity profile I as shown in FIG. 3b of trapezoidal shape wherein the leading and trailing edges are sloped indicating that the image is not sharp; that is the edges are blurry and increase in intensity gradually. Thus by scanning a smeared image and analyzing the scan data, it can be determined with a high degree of accuracy whether a smeared line image is parallel to the smear direction. Detection accuracies of substantially better than one degree have been realized with microcircuit chips.

Figure 4:
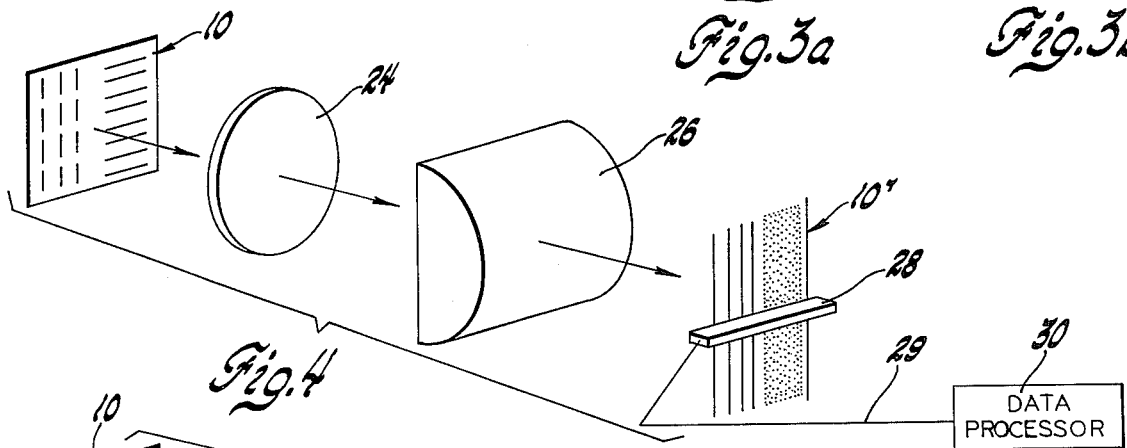
FIGS. 4 and 5 are optical systems according to the invention for determining angular orientation of an object.

In practice the method may be carried out by the simplified apparatus of FIG. 4 comprising the object 10, an imaging lens 24, a cylindrical smearing lens 26 and a linear diode array 28 in the image plane and preferably parallel with the axis of the cylindrical lens 26. The linear diode array is a linear arrangement of many photodiodes spaced one mil apart. Such arrays are available in varying sizes depending upon the number of points along a line at which light intensity measurements are desired. For example, the Recticon photodiode array RL-1024 comprises 1,024 photodiodes and includes electronic scanning circuitry which individually interrogates the photodiodes in sequence at a given rate and thus provides a video profile signal on line 29 bearing an electrical representation of the image pattern cross section. The profile signal is then analyzed by a data processor 30 to determine object orientation.

Figure 5:
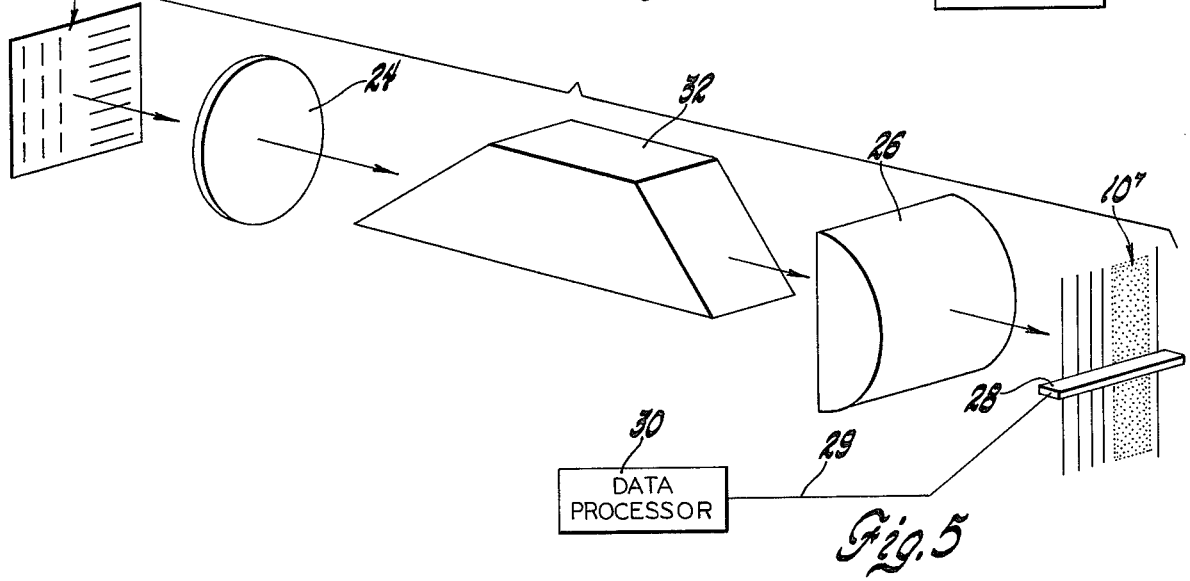
Figure 6:
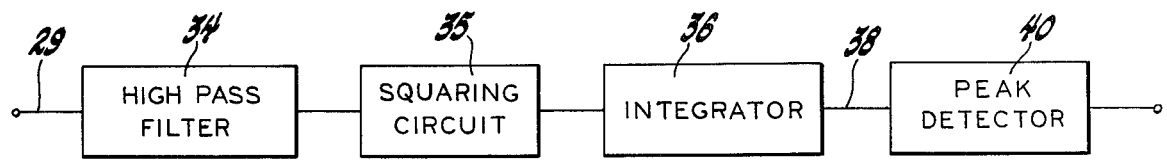
FIG. 6 is a block diagram of a data processing circuit for determining angular orientation of an object useful with the systems of FIGS. 4 and 5.

Image sharpness is varied by any one of several procedures: 1. Rotate the object 10 with the optics (24, 26, 28) stationary. 2. Rotate the optics (24, 26, 28) or camera and leave the object stationary. 3. Rotate the cylindrical lens 26 — detector 28 combination only. 4. Rotate the smearing lens 26 only. That arrangement introduces a nonlinearity into the signal so that the data processing should include compensation for an angle dependent scale factor. That nonlinearity is negligible, however, for very small angles between the detector 28 and lens 26. 5. Include an image rotator 32 such as the dove prism shown in FIG. 5, and rotate that element to effect image rotation. In each case the relative angle between the image and the cylindrical lens is changed. Image rotation is continued until the smeared image passes through its sharpest appearance as detected photoelectrically and the angular position of the rotating member is noted at the position of sharpest image. That angle then is related to the angular orientation of the part.

Processing the data acquired by the linear diode array can be performed by several methods each of which determine when the contrast and the fine detail in the smeared image is sharpest, i.e. when the smear direction coincides with a dominant line pattern direction. In one method the high frequency energy of the video profile signal on line 29 is measured and the angle at which maximum energy occurs is located. The signal on line 29 is filtered by a high pass filter 34, squared by squaring circuit 35 and integrated by integrator 36 which produces an output on line 38 representing the high frequency energy in the time varying video signal. As is well known from the method of Fourier analysis, square wave signals like that of FIG. 2b have a greater high frequency content than signals with gentler sloping edges as in FIG. 3b. Thus by seeking the angle at which the high frequency energy on line 38 becomes maximum during angle rotation by a peak detector 40, the angle at which the sharpest image occurs can be located.

Figure 7:
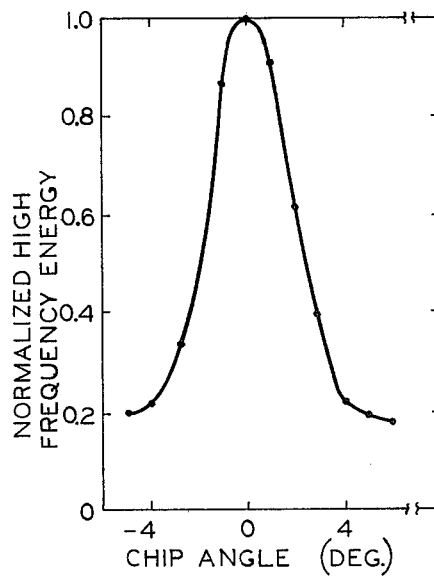
FIG. 7 is a plot of high frequency energy versus object angle as determined by the circuit of FIG. 6.

FIG. 7 illustrates a graph of normalized high frequency energy versus chip angle for actual microcircuit chip data. It should be noted that the energy curve has a relatively sharp peak and falls away rapidly for small deviations from the zero angle, thereby indicating high sensitivity of the system.

Figure 8:
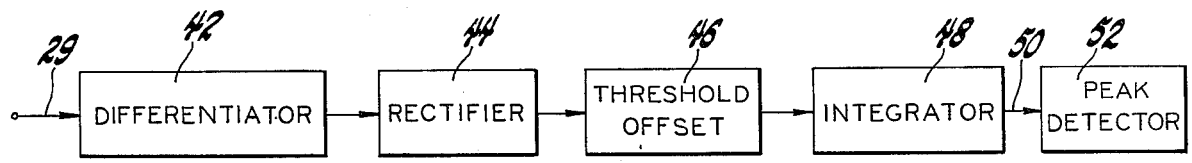
FIG. 8 is a block diagram of a data processing circuit for determining the contrast of an image for use with the systems of FIGS. 4 and 5.

Another data processing method seeks to electronically measure the contrast of the smeared image lines. In FIG. 8 the signal on line 29 is fed to a differentiator 42 which, of course, produces an output proportional to the slope of the line edges. A full wave rectifier 44 determines the absolute value of the differentiator signal and a threshold offset element 46 effectively removes the lower portions of the rectified signal so that primarily the peak values corresponding to the steepest slopes remain. That value is integrated by integrator 48 to produce a signal on line 50 corresponding to contrast of the image. A peak detector 52 determines the angle at which the maximum contrast occurs whereby the orientation of the object 10 is determined.

A third method of determining angular orientation is electronic correlation. As the video signal on line 29 is produced for each scan at various image angles, the electrical signal is compared by conventional correlation techniques with a stored signal for a similar image at a known angular orientation so that when correlation is achieved, the angular orientation of the object is determined. By using another correlation technique, image rotation can be avoided. In that case many reference scans of the image at various angles are stored in a computer memory. The number of actual reference scans required depends on the desired angular resolution and reliability. Then the actual data on line 29 is compared to a number of the reference scans via the correlation method to identify the object orientation. The correlation methods referred to are well known. The following literature offers an explanation of correlation: Turin, George ., "An Introduction to Matched Filters", IRE Transactions, Vol. IT-6 No. 3, pp. 311–329, June 1960.

After angular orientation is determined, it is then possible to determine the coordinate position of the object. Correlation methods are also used for that identification using the sharpest smeared image 10' obtained during the angle orientation procedure. The video profile scan on line 29 is compared with a stored scan of a similar object at a known coordinate position, say along an X axis and the correlation method is used to reveal the position of the actual object relative to that of the reference. Then assuming that the object has a second pattern of parallel lines orthogonal to the first, the image is rotated 90° and the video profile of the new smeared line image is correlated with a similar signal of known position to determine the Y coordinate of the object.

Figure 9:
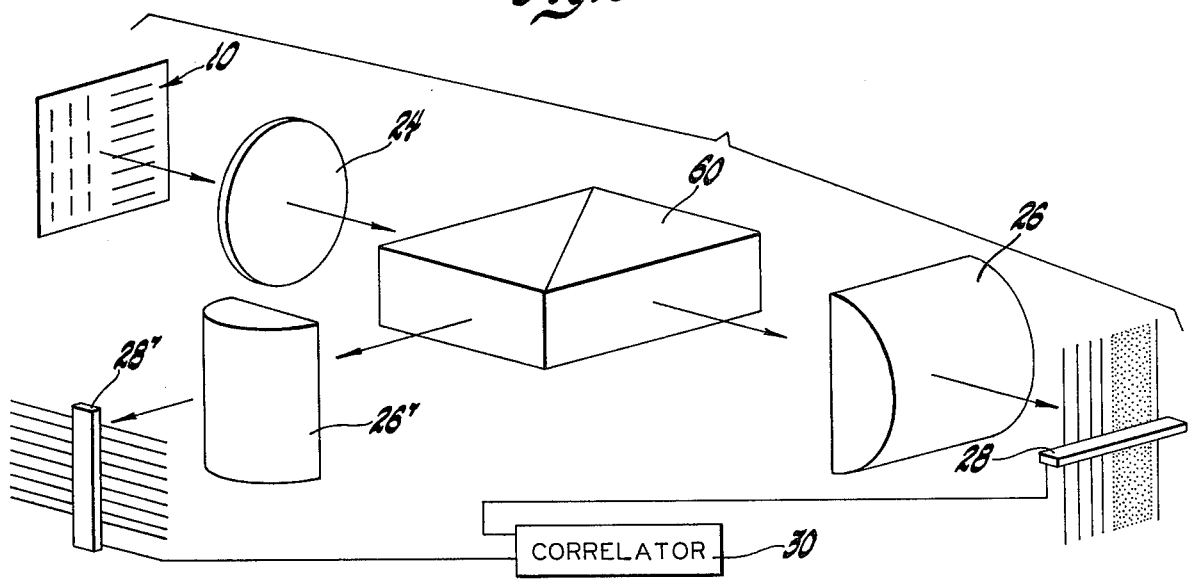
FIG. 9 is a multi-channel optical system for determining angular and coordinate position of an object according to the invention.

In FIG. 9 a two-channel system is shown including the object 10, an imaging lens 24, a beam splitter 60, a cylindrical lens 26 and a linear diode array 28 aligned with one output face of the beam splitter while a cylindrical lens 26' and detector 28' are aligned with the other output face of the beam splitter 60. The cylindrical lens 26' is positioned orthogonal to lens 26 so that both horizontal and vertical smearing and photoelectric scanning can occur simultaneously to establish coordinate position, there being no need for a 90° image rotation. If the two families of parallel lines are not orthogonal, the cylindrical lenses are adjusted accordingly so that both smeared images reach their maximum sharpness simultaneously. Only one of the detector systems need be utilized for angular orientation of the object 10. An image rotator like that shown in FIG. 5 could be included as convenient in the system preferably between the object 10 and the beam splitter 60, although other image rotation techniques described relative to FIG. 4 could be utilized.

It will be seen that where, as in the case of most microcircuit chips, there are two dominant families of parallel lines which are usually but not necessarily orthogonal, the coordinate position of the object can be accurately obtained in two dimensional space after the angular orientation has been established. In some cases it would be desirable to mask out the video signals emanating from the edges of the objects if the physical edges are not parallel with more important features of the object such as the structure of a microcircuit chip. To enhance the optical response of a chip pattern, it may be desirable to design into the chip long narrow border lines parallel to the chip line features of interest. In this way stronger image lines may be produced which are more effective for accurate orientation determination than a plurality of shorter lines inherent in the design of a given chip.

The method as described herein will be seen as useful for determining the orientation of objects such as microcircuit chips and the information once attained may be used in moving the object to a desired location or for operating upon the object at its existing location.

The embodiments of the invention in which an exclusive property or privilege is claimed are defined as follows:

1. The method of determining the orientation of an industrial part wherein the part is characterized by a pattern of dominant parallel lines comprising the steps of optically forming an image of the said part and smearing the image by at least one cylindrical lens having a cylinder axes to thereby smear the image as a function of the angle between the said parallel lines and the cylinder axis, the smeared image lines being sharpest when the direction of smearing is parallel to the said parallel lines and the smeared image lines are less sharp when the direction of smear differs from the direction of the parallel lines, angularly scanning the part by rotating the image of the part relative to the cylindrical lens so that the smeared line image sharpness varies according to the angle of image rotation, photoelectrically detecting the smeared line image to acquire data on image sharpness, and processing the acquired data to establish the angle of image rotation which results in the sharpest image and relating that angle to the angular orientation of said pattern of parallel lines.

2. The method of determining the orientation of an industrial part wherein the part is characterized by a pattern of dominant parallel lines comprising the steps of optically forming an image of the said parts and smearing the image by at least one cylindrical lens having a cylinder axis to thereby smear the image as a function of the angle between the said parallel lines and the cylinder axis, the smeared image lines being sharpest when the direction of smearing is parallel to the said parallel lines and the smeared image lines are less sharp when the direction of smear differs from the direction of the parallel lines, angularly scanning the part by mechanically rotating the part to thereby rotate the image of the part relative to the cylindrical lens so that the smeared line image sharpness varies according to the angle of image rotation, photoelectrically detecting the smeared line image to acquire data on image sharpness, and processing the acquired data to establish the angle of part rotation which results in the sharpest image and relating that angle to the angular orientation of said pattern of parallel lines.

3. The method of determining the orientation of an industrial part wherein the part is characterized by a pattern of dominant parallel lines comprising the steps of optically forming an image of the said part and smearing the image by at least one cylindrical lens having a cylinder axis to thereby smear the image as a function of the angle between the said parallel lines and the cylinder axis, the smeared image lines being sharpest when the direction of smearing is parallel to the said parallel lines and the smeared image lines are less sharp when the direction of smear differs from the direction of the parallel lines, angularly scanning the part by rotating the image of the part relative to the cylindrical lens so that the smeared line image sharpness varies according to the angle of image rotation, photoelectrically detecting the smeared line image to acquire data on image sharpness, providing reference data on image sharpness of a similar pattern having known orientation and storing that reference data, and processing the acquired data to establish the angle of image rotation which results in the sharpest image by correlating the data with said stored reference data on the smeared pattern having known angular orientation.

4. The method of determining the orientation of an industrial part wherein the part is characterized by a pattern of dominant parallel lines comprising the steps of optically forming an image of the said part and smearing the image by at least one cylindrical lens having a cylinder axis to thereby smear the image as a function of the angle between the said parallel lines and the cylinder axis, the smeared image lines being sharpest when the direction of smearing is parallel to the said parallel lines and the smeared image lines are less sharp when the direction of smear differs from the direction of the parallel lines, angularly scanning the part by rotating the image of the part relative to the cylindrical lens so that the smeared line image sharpness varies according to the angle of image rotation, at a plurality of discrete angles of image rotation photoelectrically scanning across the smeared line image to generate a time varying electrical signal representative of the said smeared image, high pass filtering the signal, squaring the filtered signal and integrating the squared signal to determine high frequency content of the electrical signal, determining the angle of image rotation which results in the maximum high frequency content and therefore the sharpest image, and relating that angle to the angular orientation of said pattern of parallel lines.

5. The method of determining the orientation of an industrial part wherein the part is characterized by a pattern of dominant parallel lines comprising the steps of optically forming an image of the said part and smearing the image by at least one cylindrical lens having a cylinder axis to thereby smear the image as a function of the angle between the said parallel lines and the cylinder axis, the smeared image lines being sharpest when the direction of smearing is parallel to the said parallel lines and the smeared image lines are less sharp when the direction of smear differs from the direction of the parallel lines, angularly scanning the part by rotating the image of the part relative to the cylindrical lens so that the smeared line image sharpness varies according to the angle of image rotation, at a plurality of discrete angles of image rotation photoelectrically scanning across the smeared line image to generate a time varying electrical signal representative of the said smeared image, differentiating the signal, rectifying the differentiated signal and integrating at least the peak portions of the rectified signal over the scan across the image, to obtain a measure of the image contrast, and determining the angle of the part at which maximum contrast occurs.

6. The method of determining the orientation of an industrial part wherein the part is characterized by a pattern of dominant parallel lines comprising the steps of optically forming an image of the said part and smearing the image by at least one cylindrical lens having a cylinder axis to thereby smear the image as a function of the angle between the said parallel lines and the cylinder axis, the smeared image lines being sharpest when the direction of smearing is parallel to the said parallel lines and the smeared image lines are less sharp when the direction of smear differs from the direction of the parallel lines, angularly scanning the part by rotating the image of the part relative to the cylindrical lens so that the smeared line image sharpness varies according to the angle of image rotation, photoelectrically detecting the smeared line image to acquire data on image sharpness, and processing the acquired data to establish the angle of image rotation which results in the sharpest image and relating that angle to the angular orientation of said pattern of parallel lines, and then optically sensing the pattern of parallel lines and determining from such pattern the coordinate position of the part.

7. The method of determining the orientation of an industrial part wherein the part is characterized by a pattern of dominant parallel lines comprising the steps of optically forming an image of the said part and smearing the image by at least one cylindrical lens having a cylinder axis to thereby smear the image as a function of the angle between the said parallel lines and the cylinder axis, the smeared image lines being sharpest when the direction of smearing is parallel to the said parallel lines and the smeared image lines are less sharp when the direction of smear differs from the direction of the parallel lines, angularly scanning the part by rotating the image of the part relative to the cylindrical lens so that the smeared line image sharpness varies according to the angle of image rotation, photoelectrically detecting the smeared line image to acquire data on image sharpness, and processing the acquired data to establish the angle of image rotation which results in the sharpest image and relating that angle to the angular orientation of said pattern of parallel lines, providing reference data on image profile of a similar image having a known coordinate position and storing that reference data, and then correlating the smeared image data corresponding to the angle of maximum sharpness with said stored reference data of such an image at a known coordinate position thereby determining the coordinate position of the part.

* * * * *